United States Patent [19]
Derkits, Jr. et al.

[11] Patent Number: 4,758,534
[45] Date of Patent: Jul. 19, 1988

[54] PROCESS FOR PRODUCING POROUS REFRACTORY METAL LAYERS EMBEDDED IN SEMICONDUCTOR DEVICES

[75] Inventors: Gustav E. Derkits, Jr., New Providence; James P. Harbison, Summit, both of N.J.

[73] Assignee: Bell Communications Research, Inc., Livingston, N.J.

[21] Appl. No.: 797,694

[22] Filed: Nov. 13, 1985

[51] Int. Cl.$^4$ .................. H01L 21/20; H01L 21/74
[52] U.S. Cl. .................. 437/89; 148/DIG. 26; 148/DIG. 72; 148/DIG. 142; 148/DIG. 164; 148/DIG. 160; 156/610; 156/614; 357/16; 357/56; 357/88; 437/107; 437/110; 437/111; 437/133; 437/176; 437/915; 437/970
[58] Field of Search .................. 29/576 E, 571, 572; 357/34; 148/175, DIG. 142

[56] References Cited

U.S. PATENT DOCUMENTS

| | | | |
|---|---|---|---|
| 3,322,581 | 5/1967 | Hendrickson et al. | 148/DIG. 142 |
| 3,375,418 | 3/1968 | Garnache et al. | 317/235 |
| 3,394,289 | 7/1968 | Lindmayer | 317/235 |
| 3,401,449 | 9/1968 | Show | 148/DIG. 142 |
| 3,424,627 | 1/1969 | Michel et al. | 148/DIG. 142 |
| 3,915,765 | 10/1975 | Cho et al. | 148/175 |
| 4,378,629 | 4/1983 | Bozler et al. | 29/580 |
| 4,404,235 | 9/1983 | Tarng et al. | 427/89 |

OTHER PUBLICATIONS

*Solid State Technology*, Oct. 1982, "Application of Molecular Beam Epitaxy to III-V, Microwave and High Speed Device Fabrication" pp. 166-169, by J. C. M. Hwang et al.
*Silicides for VLSI Application*, by S. P. Muravka, Academic Press., pp. 172-175.
*Surface Science*, 168(1986), 438-497, "Silicon MBE: Recent Developments" by F. Arnaud d'Avitaya et al., (North-Holland, Amsterdam).

*Thin Solid Film* 93(1982), pp. 77-90, "Epitaxial Silicides" by R. T. Tung et al.
*J. Electrochem Soc.; Solid State Science and Technology*, vol. 127, No. 7, Jul., 1980, "Lateral Definition of Monocrystalline GaAs Prepared by Molecular Beam Epitaxy", by S. Hiyamigu et al., pp. 1564-1567.
*Appl. Phys. Letter*, vol. 23, No. 4, Aug. 1973, pp. 201-203, "Molecular Beam Epitaxy of Alternating Metal-Semiconductor Films", by R. Ludeke et al.
*IBM Technical Disclosure Bulletin*, vol. 16, No. 4, Sept., 1973, p. 1231, Novel Epitaxy", by L. Esaki et al.
"Fabrication and Microwave Performance of the Permeable Base Transistor", by C. O. Bozler, G. D. Alley, R. A. Murphy, D. C. Flanders, W. T. Lindley, *IEEE Tech. Dig. Int. Electr. Dev. Mtg.*, 384, (1979), pp. 384-387.
"Silicon/Metal Silicide Heterostructures Grown by Molecular Beam Epitaxy", by J. C. Bean, J. M. Poate, *Applied Phys. Lett.*, vol. 37, Oct. 1, 1980, pp. 643-646.
"Transistor Action in Si/CoSi$_2$Si Heterostructures", by J. C. Hensel, A. F. J. Levi, R. T. Tung and J. M. Gibson, *Applied Phys. Lett.*, vol. 47, Jul. 15, 1985, pp. 151-153.
Rosencher et al., "Transistor Effect in Monolithic Si/CoSi$_2$/Si, Epitaxial Structures", *Electronic Letters*, vol. 20, Sep. 13, 1984, pp. 762-764.

*Primary Examiner*—Brian E. Hearn
*Assistant Examiner*—William D. Bunch
*Attorney, Agent, or Firm*—James W. Falk; Edward M. Fink

[57] ABSTRACT

A process for fabricating a semiconductor-metal-semiconductor electronic device and the device formed thereby from a semiconductor substrate is described. The substrate forms a first active region of the device. A porous layer of conductive material is deposited on the substrate preferably by molecular beam epitaxy forming a control region. A layer of a semiconductor material epitaxially matched to the substrate is then grown on the layer of conductive material so that the layer of semiconductor material forms a second active region of an electronic device.

8 Claims, 3 Drawing Sheets

PROCESS FOR PRODUCING POROUS REFRACTORY METAL LAYERS EMBEDDED IN SEMICONDUCTOR DEVICES

BACKGROUND OF THE INVENTION

1. Field of the Invention

The invention relates to molecular beam epitaxial growth methods of semiconductor device fabrication, and in particular a method of forming a semiconductor device having a simiconductor-metal-semiconductor structure in which the metal is porous and the two layers of semiconductor material are epitaxially matched, and devices made thereby.

2. Description of the Prior Art

The use of porous or perforated layers in a semiconductor structure is known for certain special purpose applications, such as in gas detectors, solar cells, and lasers. U.S. Pat. No. 4,505,803 describes an oxygen concentration detector which employs a porous diffusion layer of alumina spinel on the surface of a semiconductor body. U.S. Pat. No. 4,449,286 describes a solar cell including a silicon layer which is porous. U.S. Pat. No. 4,264,381 describes the fabrication of injection lasers in which a porous host diffusion layer is employed.

More particularly, the use of a porous metal layer in a semiconductor-metal-semiconductor structure has been suggested in "The Metal Gate Transistor," J. Lindmayer, Proceedings of the IEEE, 1964, p. 1751 and more recently in "Transistor Action in Si/CoSi$_2$/Si Heterostructures", J. Hensel, A. Levi, R. Tung and J. Gibson, Applied Physics Letters, Vol. 47, p. 151, July 15, 1985, in which electrical conduction from one semiconductor region to another is proposed to be modulated by electric fields existing in holes in the metal layer. In the structures disclosed in such references, spontaneously-occurring perforations in the metal are used as the basis for electrical modulation of the current passing from one semiconductor layer to another, typically in an epitaxial structure consisting of silicon, cobalt silicide and silicon. The growth of the upper layer of epitaxial silicon in such structures is achieved by the use of epitaxial cobalt silicide (CoSi$_2$) or other epitaxial silicide which is lattice matched to silicon to within a few percent. Further, regular lattices or networks of holes in metal layers formed by lithographic means are used both as conducting paths between two semiconductor layers and as a means of allowing epitaxial growth in the fabrication of devices known as permeable base transistors, such as discussed in "Fabrication and Microwave Performance of the Permeable Base Transistor," C. O. Bozler, G. D. Alley, R. A. Murphy, D. C. Flanders and W. T. Lindly, IEEE Tech. Dig. Int. Electron Devices Meeting 384 (1979).

The silicon/metal silicide heterostructures grown by molecular beam epitaxy known in the prior art utilize a technique known as strained layer epitaxy which requires that the intermediate layer such as the metal silicide be substantially latticed matched with the native or lower layer. The strain induced in the material itself provides lattice matching, however such lattice matching is not without disadvantages. The strain created in the intermediate layer may be transferred to the semiconductor, which may result in defects in the semiconductor layer which may affect active devices therein. The lattice matching between the upper semiconductor layer and the lower semiconductor layer is achieved by virtue of the upper layer being lattice matched with the intermediate layer which in turn is lattice matched with the lower layer. The lattice matching therefore does not take place by growth in a direction parallel to the plane of the semiconductor body (which is known as lateral epitaxy) and the reproducibility of the prior art epitaxial growth technique in a production environment for a large number of wafers may be questionable.

More importantly, the silicon/metal silicide heterostructures of the prior art are limited to specific classes of semiconductors and compounds. There are no known intermediate metal layers for use with semiconductors of the III-V classes which would provide similar structures of silicon/metal silicide heterostructures, and even with silicon semiconductor devices the use of materials such as refractory metals which are substantially mismatched to the structure of the silicon is not possible. Thus, if the physical or electrical characteristics of the intermediate layer required the use of a particular type of metal which was not lattice matched with the lower layer, the teachings of the prior art heterostructures would be of no use.

With respect to the permeable base transistor structure described above in the Bozler et al. reference, it is noted that the metal is patterned after deposition by a separate lithographic step to produce a structure containing openings in a regular pattern. The metal layer is not porous when deposited, and the requirement for separate patterning and etching steps to produce holes in the metal layer is also not desirable from a production viewpoint.

"Silicon/metal Silicide Heterostructures Grown by Molecular Beam Epitaxy", by J. C. Bean and J. M. Poate, Applied Physics Letters, Vol. 37, p. 643, Oct. 1, 1980, discloses a method for the overgrowth of epitaxial silicide metal layers on silicon and subsequent overgrowth of epitaxial silicon layers on the silicide by molecular beam epitaxy (MBE) using lattice matching of the silicide to silicon to establish a template for the upper silicon layer. Such technique of silicide matching is also disclosed in U.S. Pat. No. 3,375,418 to R. R. Garnache and F. L. Vogel, in which restricted area geometries are used to enhance monocrystallinity of the silicide layer for silicides which normally do not match silicon very well. An application of such technique to the production of a device is discussed in E. Rosencher, S. Delage, T. Campidelli, and F. Armand D'Avitaya, "Transistor Effect in Monolithic Si/CoSi$_2$/Si Epitaxial Structures", Electronics Letters, Vol. 20, p. 762, Sept. 13, 1984.

The semiconductor-metal semiconductor structures described in the references summarized above are disadvantageous in that they require either the use of a metal layer which is closely epitaxially matched to the semiconductor layers, as in the work of Bean et al. and Garnache et al. described above, or they require a separate processing step of patterning as in the work of Bozler et al. to achieve epitaxial growth of semiconductor layers deposited after deposition of a non-epitaxial metal layer. Prior to the present invention, the epitaxial growth of a second semiconductor layer has not been achieved as part of an uninterrupted growth sequence in which control of temperature, deposition rate and metal thickness are used to produce metallic layers of a porous nature suitable for the growth of a second semiconductor layer epitaxially matched to the first. Prior to the present invention the free use of non-epitaxial metallic layers to create a semiconductor-metal-semiconductor structure in an uninterrupted growth sequence has not been suggested.

SUMMARY OF THE INVENTION

Briefly, and in general terms, the present invention provides a method of fabricating a semiconductor device by providing a semiconductor body having a major surface; depositing a layer of a porous conductive material, preferably a refractory metal, on the major surface of the semiconductor body; and forming a layer of a semiconductor material so that the semiconductor layer is epitaxially matched to the semicondutor body.

More particularly, it is an object of the invention to provide a method for making a semiconductor-metal-semiconductor electronic device in an uninterrupted growth sequence in which the metal is non-epitaxial and the growth of the second semiconductor layer is epitaxially matched to the first. Advantageously, molecular beam epitaxy may be used both for the deposition of the metal layer and the growth of the second semiconductor layer.

The invention further provides a semiconductor-metal-semiconductor electronic device including a semiconductor substrate of gallium arsenide including a first active region; a porous layer of conductive material disposed on the substrate forming a control region; and a layer of a semiconductor material epitaxially matched to the substrate disposed on the layer of conductive material forming a second active region of the electronic device.

The novel features which are considered as characteristic for the invention are set forth in particular in the appended claims. The invention itself, however, both as to its construction and its method of operation, together with addition objects and advantages thereof will be best understood from the following description of specific embodiments when read in connection with the accompanying drawing.

DESCRIPTION OF THE PREFERRED EMBODIMENTS

Figure 1:
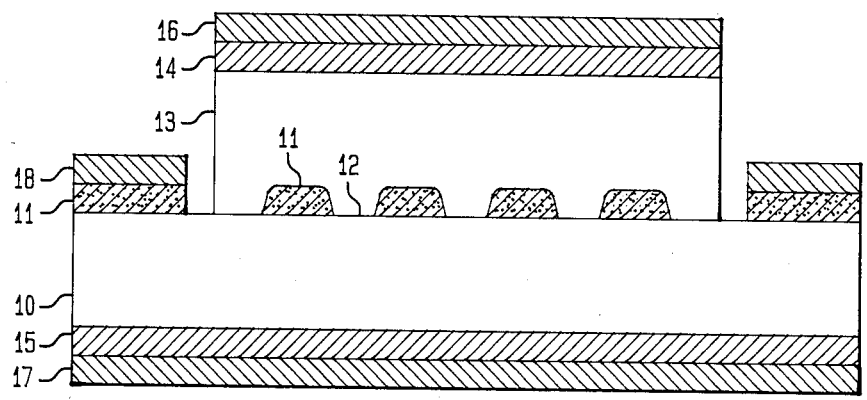
FIG. 1 shows a cross sectional view of a portion of a semiconductor device which incorporates a semiconductor-metal-semiconductor structure known in the prior art.

In many applications of semiconductor devices it may be desirable to have a highly conductive layer within the body of a semiconductor structure in such a position that the layer is surrounded on both top and bottom by semiconductor material which may be epitaxially grown. FIG. 1 shows a cross sectional view of a portion of a semiconductor body which incorporates a semiconductor-metal-semiconductor structure illustrating the incorporation of such a layer as is known in the prior art.

More particularly, FIG. 1 illustrates an example of semiconductor-metal-semiconductor structure which includes a first semiconductor layer 10 and a metal layer 11 which has been lithographically patterned and etched to produce a structure with open spaces 12 extending through the metal layer 11 to the first layer 10. A second semiconductor layer 13 is provided which is epitaxially grown (by "strained layer" epitaxy as discussed above) on the first semiconductor layer 10. An ohmic metallization layer 14 is provided which is disposed over the second semiconductor layer 13, and an ohmic metallization layer 15 is provided which is disposed on the bottom surface of the first semiconductor layer 10 in order to provide a low resistance electrical contact to the semiconductor. A contact metallization layer 16 is applied to the ohmic metallization 14, and a contact metallization layer 17 is applied to the ohmic metallization 15 according to techniques known in the art. A contact metallization layer 18 is also applied to the metal layer 11. The contact metallization layers function to provide means for applying electrical voltages or current signals to certain predetermined layers and detecting the resulting voltage or current in others of the semiconductor device.

Figure 2:
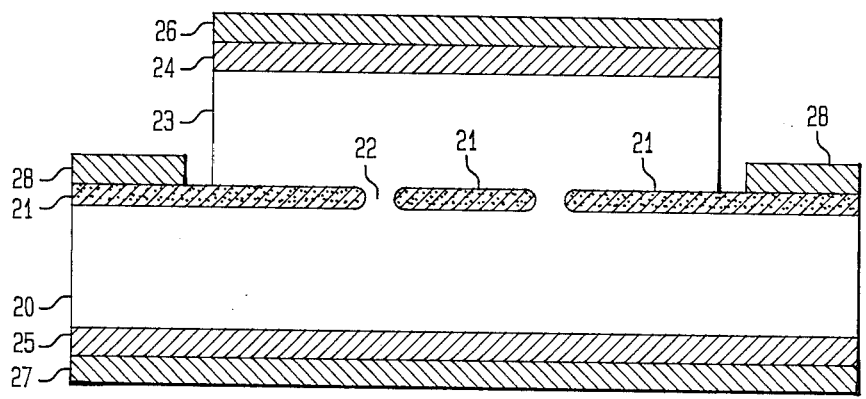
FIG. 2 shows a cross sectional view of another type of semiconductor device known in the prior art as disclosed in the above-cited paper of Hensel and referred to as a silicon-silicide-silicon transistor in which an epitaxially matched metal layer containing perforations is incorporated between two semiconductor layers.

FIG. 2 illustrates another example of a prior art semiconductor-metal-semiconductor structure including a first semiconductor layer 20 and a metal layer 21 which is epitaxially grown on the first semiconductor layer 20. After deposition, the metal layer 21 may be etched to produce perforations 22 extending through the layer 21. The metal layer 21 is closely lattice matched to the first semiconductor layer 20, providing a template for the epitaxial growth of the second semiconductor layer 23. The perforations 22 in the metal layer 21 allow the efficient flow of electrical current from the first semiconductor layer 20 to the second semiconductor layer 23 when the structure is operated as an electronic device. Also shown is an ohmic metallization layer 24 to the second semiconductor layer 23 and an ohmic metallization layer 25 to the first semiconductor layer 20, which provides a low resistance electrical contact to these layers. A contact metallization 26 to the ohmic metallization 24, a contact metallization 27 to the ohmic metallization 25, and a contact metallization 28 to the metal layer 21 is also shown which provides means for applying electrical voltage or current signals to the layers of the device and detecting the resulting voltage or current therein similar to the operation of the device of FIG. 1.

Figure 3A:
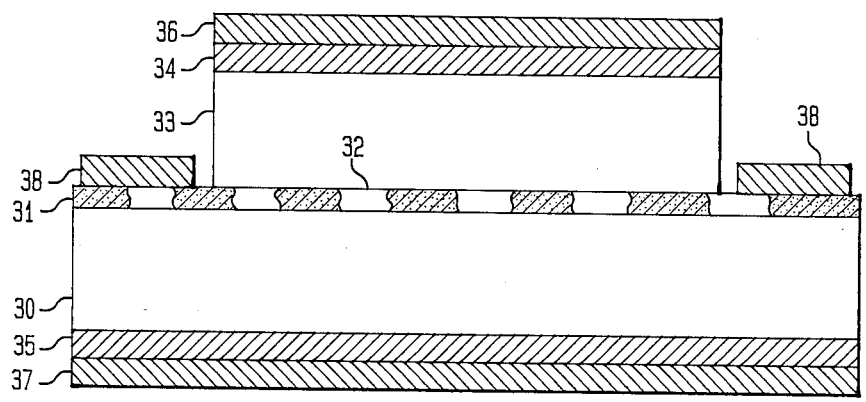
FIG. 3(a) shows a cross sectional view of a portion of a semiconductor body which was formed according to a first embodiment of the method according to the present invention.

FIG. 3a illustrates a first preferred embodiment of the present invention. The Figure shows a semiconductor body that includes a first semiconductor layer 30 and a conductive or metal layer 31 disposed over the major surface of the semiconductor layer 30. The metal layer 30 is grown under conditions which produce spontaneously occurring apertures or perforations 32 in such layer. A second semiconductor layer 33 is disposed over the metal layer 30. The semiconductor layer 33 is patterned by lithographic techniques and etched to expose the metal layer 31 in parts. Ohmic metallization 34 is applied to the second semiconductor layer 33, ohmic metallization 35 is applied to the back of the first semiconductor layer 30. The ohmic metallizations provide a low resistance contact to the semiconductor layers. Contact metallization 36 to the ohmic metallization 34, contact metallization 37 to the ohmic metallization 35 and contact metallization 38 to the metal layer 31 are also provided for applying electrical current and voltage signals to the layers and detecting the electrical currents and voltages therein. The preferred embodiment in FIG. 3a constitutes a type of metal base transistor.

In this first preferred embodiment of the present invention, the first semiconductor layer 30 may advantageously comprise a lightly-doped layer of gallium arsenide semiconductor material with n-type conductivity doped to a level of $10^{16}/cm^3$ with silicon dopant atoms and having a thickness of about 1 micron, grown epitaxially on an n+ heavily-doped gallium arsenide substrate at a temperature of 625° C. in a molecular beam epitaxy apparatus. The metal layer 31 may consist of tungsten metal grown immediately after the first semiconductor layer 30 in the same molecular beam epitaxy growth chamber to a thickness of approximately 10 nanometers at a deposition rate of approximately 0.1 nm/sec. and a temperature of about 700° C. The growth conditions described herein have been shown by experiment to result in the growth of a porous layer of electrically-connected metal with perforations 32 disposed over approximately from 4 to 10% of the total surface area of the metal layer. The second semiconductor layer 33 may advantageously be composed of n-type gallium arsenide material grown at a temperature of 625° C. to a total thickness of about 1 micron with a doping of approximately $5 \times 10^{16}/cm^3$ of silicon atoms, grown in the same chamber by molecular beam epitaxy.

The provision of a porous interlayer in a semiconductor structure is particularly advantageous in that it enables the epitaxial growth of the upper semiconductor layer to take place by means of a technique of lateral epitaxy, as opposed to the technique of strained layer epitaxy such as in the silicon/metal silicide systems known in the prior art. Lateral epitaxy provides a more consistent reproduction of the lattice match with the lower semiconductor layer and therefore greater reproducibility of the semiconductor-interlayer-semiconductor structure in a production environment. In complex semiconductor devices, in which the active regions extend not over a planer surface but in three dimensions, the necessity of lateral epitaxy may be highly important in being able to fabricate non-planar device geometries. There are similar advantages to such lateral epitaxy fabrication with structures including multiple semiconductor layers or other configurations in which it may not be possible to achieve epitaxial matching using the techniques of the prior art.

As noted above, the use of molecular beam epitaxy (MBE) is the preferred way of preparing ultraclean well characterized metal/semiconductor interfaces in the present invention. Moreover, both the metal and semiconductor materials can be deposited sequentially by MBE in the same UHV environment. A number of metals, including aluminum, silver, and iron, have been deposited epitaxially as single crystal overlayers on GaAs. In previous studies metal layers have been deposited at relatively low substrate temperatures (from 20° to 200° C.) in order to prevent reaction between the GaAs and the metal overlayer.

Although molecular beam epitaxy is the preferred process technique according to the present invention, other evaporative techniques in which suitable control over the process parameters is possible may be used as well. The use of MBE has been shown to be particularly advantageous in the embodiment of a tungsten interlayer within a gallium arsenide semiconductor structure. The use of other refractory materials or metals as, for example, tungsten silicides and the use of semiconductors other than gallium arsenide are also within the scope of the present invention. The use of alternative deposition techniques, including chemical vapor deposition, vapor phase epitaxy, and sputtering may also be utilized. A careful control of the process parameters associated with such techniques, together with the isolation of impurities created as a byproduct of the deposition process, may make such process techniques applicable to other heterostructures in which it is desired to form a porous interlayer.

The invention may further be described as providing a semiconductor-metal-semiconductor electronic device which includes a semiconductor substrate of gallium arsenide including a first active region; a naturally formed porous layer of conductive material disposed on the substrate forming a control region; and a layer of a semiconductor material epitaxially matched to the substrate disposed on the layer of conductive material forming a second active region of the electronic device. By a "naturally formed" porous layer we mean a layer in which the pores or apertures in the metal or conductive layer are formed spontaneously during the process of deposition.

Some proposed device structures require a metal layer surrounded by semiconductor material above as well as below it. One such concept is the metal base transistor, such as the $Si/CoSi_2/Si$ system where the buried metallic silicide layer is in epitaxial registry with the adjacent silicon layers. The difficulty with realizing such a structure in the III-V semiconductor material is finding a metal which is both epitaxially matched to GaAs as well as one which is unreactive with it at the typical growth temperatures of 550°–700° C. which would be required to overgrow the GaAs on top of the metal layers.

The preferred single element candidate in terms of low reactivity and interdiffusivity with respect to GaAs at the temperatures used in the present process is tungsten. Previous studies of tungsten deposited in situ on GaAs by MBE have shown that the tungsten has a class of morphological phases depending on the thickness and growth conditions. One application which makes use of the stability of the tungsten/GaAs interface at GaAs growth temperatures is tungsten patterning, shown to be a technique for selective area III-V MBE growth. Another application is the use of tungsten as a self-aligned gate material for metal semiconductor field effect transistors (MESFET's) in which the source and drain contacts are fabricated using ion implantation. Such technique requires high temperature (900° C.) activation anneals with the gate metal in place. The stability of tungsten on GaAs is also the reason that the permeable base transistor (PBT) has been fabricated with a tungsten metal grid buried in GaAs. However, during the fabrication of the FET and PBT structures discussed in the prior art above, the tungsten layer has not been deposited in the MBE chamber as in the present invention, and in the case of overgrowth as in the PBT, the overgrowth occurs on an air exposed surface. The disadvantages of such fabrication techniques have previously been discussed.

Returning to the description of FIG. 3a, the ohmic metallization 34 to the second semiconductor layer 33 and the ohmic metallization 35 to the first semiconductor layer 30 may advantageously include a sequence of layers consisting of a layer of gold 10 nanometers thick, a layer of tin 10 nanometers thick, and a layer of gold 100 nanometers thick, the layers being alloyed in a hydrogen atmosphere at 420 degrees centigrade for thirty seconds.

The contact metallization 36 to the ohmic metallization 34, the contact metallization 37 to the ohmic metallization 35, and the contact metallization 38 to the metal layer 32 may advantageously comprise a sequence of a layer of chromium 20 nanometers thick followed by a layer of gold 300 nanometers thick. The second semiconductor layer 33 may be patterned by known lithographic means by applying photoresist and exposing to ultraviolet light through a mask and developing to produce a pattern in the resist, followed by etching the semiconductor layer 33 using a liquid etch such as 4:1:1 $H_2SO_4:H_2O_2:H_2O$ which etches the semiconductor gallium arsenide at a rapid rate and etches the tungsten at a rate which is slow or zero. Alternatively, a plasma etch containing active chlorine atoms or ions such as that produced in an rf discharge of $CCl_2F_2$ at 13 megahertz at a pressure of 2.5 millitorr may be used, since it has been shown experimentally to etch gallium arsenide at a rate far exceeding the rate of etching of tungsten and has been shown that it allows the etch to stop at the tungsten layer 32 without damaging it. The contact metallization 38 can then be applied to the metal layer 32 through the opening left by this etching.

In the preferred embodiment, a thin tungsten layer is deposited within the MBE growth chamber, and followed with an MBE grown single crystal GaAs overlayer resulting in a clean metallic tungsten layer embedded within a single crystal GaAs matrix. Such a structure permits GaAs to be used in a wide range of device structures which are based upon buried metal layers.

To describe the sequence of process steps of the present invention in greater detail, it is noted that the GaAs semiconductor crystals are preferably grown in a Riber MBE-1000 system specially modified to accommodate an electron beam evaporator. The evaporator is advantageously positioned below the substrate for deposition of metals at a glancing angle onto the heated substrate while keeping the sample in the same orientation used for MBE GaAs deposition. Such an arrangement allows rapid sequential changes back and forth between GaAs growth and tungsten growth entirely through the use of shutters.

A range of samples were prepared for analysis to demonstrate the process according to the present invention. Samples were deposited on <100> GaAs substrates. In each case, a buffer layer of 1–2 $\mu$m of GaAs was first deposited. The tungsten layer thicknesses studied varied from 8 to 15 nm and the overgrown GaAs layers ranged from 1–3 $\mu$m. Reflective high energy electron diffraction (RHEED) was used throughout the deposition sequence to monitor the surface crystal structure. Samples were structurally characterized after deposition in both planar and cross-sectional view using a 120 keV Phillips 400T transmission electron microscope (TEM).

The analysis of the results of preparation of the samples show a typical sequence of RHEED patterns taken along the [110] azimuthal direction. The initial buffer layer grown at 625° C. yielded a smooth surface as seen by the extensive streaking. The twofold surface reconstruction indicates the arsenic stabilized c(2×8) structure expected for arsenic rich growth conditions.

As the next step, buffer layer growth was suspended by closing the gallium shutter. The arsenic flux remained on while the substrate temperature was elevated to 700° C. and the tungsten electron beam source was stabilized. Then, the tungsten shutter was opened and, after approximately 1 nm was deposited, the As flux was shuttered off as the tungsten deposition continued.

Previous TEM studies have shown that under these conditions, the tungsten deposits primarily as polycrystalline B-W with strongly preferred orientation along the GaAs <110> axes and along directions ten degrees off the GaAs <100> axes. This is consistent with the observed RHEED pattern of the completed 10 nm tungsten layer. In addition to the faint underlying GaAs spots, there are a set of polycrystalline rings which have intensity maxima along them indicating sets of preferred orientations, as previously mentioned above.

Once the tungsten deposition was concluded, the As shutter was reopened, and the substrate temperature was dropped back to 625° C. The resulting RHEED pattern thirty seconds after the gallium shutter was reopened for the growth of the overlayer, corresponding to 10 nm of GaAs overgrowth, shows the tungsten polycrystalline ring pattern disappeared and the GaAs spot pattern already has begun to streak with faint signs of a twofold surface reconstruction. By the end of an entire micron of overgrowth the streaking is complete, and the surface, as indicated by RHEED, appears qualitatively the same as during homoepitaxial GaAs growth on GaAs known in the art.

For structural characterization, vertical thin sections of the sample were prepared for TEM studies. An analysis of a typical cross-section view of the layered structure obtained from a thin slice cut along the <011> planes reveals details of the embedded tungsten layer. Lines inclined with respect to the tungsten layer represent micro-twinned structures, an identification made possible by analysis of the selective electron diffraction pattern obtained from the upper overgrown region. From such a diffraction pattern it has been estimated that the volume fraction of twinned material is only a few percent. The twins appear to have been nucleated at particular tungsten grains and in most cases continue all the way to the surface. The remainder of the overgrown material represents single crystal GaAs in alignment with the underlying buffer layer.

It should be noted that while the conditions given above refer specifically to the present invention and the embodiment of tungsten deposited on gallium arsenide, we have previously noted that the production of thin metal layers containing pores of the size noted above is known in metal-semiconductor systems such as $MoSi_2$-Si and $CoSi_2$-Si. The presence, density and size of such pores is a function in most systems of the metal thickness and process temperature. Hence, the method outlined above according to the present invention is applicable to the production of semiconductor-metal-semiconductor structures in other materials systems other than tungsten and gallium arsenide provided the materials can be deposited on a temperature-controlled substrate by an evaporative process such as MBE.

Figure 3B:
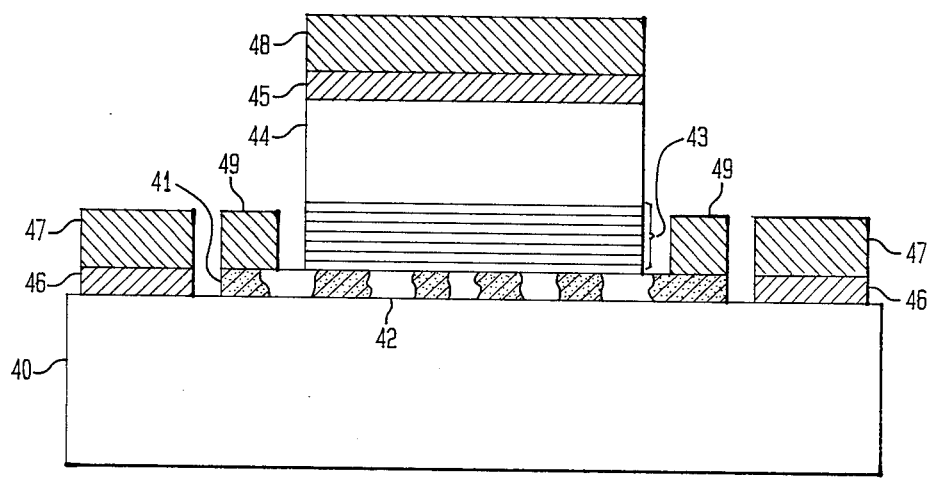
FIG. 3(b) shows a cross sectional view of a portion of a semiconductor body which was formed according to a second embodiment of the method according to the present invention.

FIG. 3b illustrates a second preferred embodiment of the present invention which includes a first semiconductor layer 40, a metal layer 41 which is grown under conditions which produce spontaneously occurring perforations 42 in such layer, a second semiconductor layer 43 which is preferably a superlattice comprising alternating layers of wide and narrow band gap semiconductor material, and a third semiconductor layer 44 which comprises narrow bandgap semiconductor material. Superlattices such as those just mentioned have been shown to improve crystal growth and electrical properties of multilayer structures. The layers 43 and 44 are patterned by lithographic techniques to expose a portion of the metal layer 41 in parts. Ohmic metallization 45 is applied to the third semiconductor layer 44, and ohmic metallization 46 is applied to the first semiconductor layer 40. The ohmic metallizations provide a low resistance electrical contact to the semiconductor layers 40 and 44 respectively. Contact metallization 47 is applied to the ohmic metallization 46, contact metallization 48 is applied to the ohmic metallization 45, and contact metallization 49 is applied to the metal layer 41. The metal layers provide means for the application of electrical current and voltage signals to the layers and detection of electrical current and voltage signals in these layers. The preferred embodiment of FIG. 3b constitutes a type of metal base transistor.

In the preferred embodiment of FIG. 3b, the first semiconductor layer 40 may advantageously include lightly-doped n-type gallium arsenide layer grown in a molecular beam epitaxy apparatus at a temperature of 625° C. epitaxially on a semi-insulating gallium arsenide substrate and doped to a level of approximately $5 \times 10^{16}/cm^3$ atoms of silicon with a thickness of about 1 micron. The metal layer 41 may advantageously comprise a layer of tungsten metal grown immediately after the first semiconductor layer 40 in the same molecular beam epitaxy growth chamber to a thickness of about 10 nanometers at a deposition rate of approximately 0.1 nm/sec. and a temperature of about 700 degrees centigrade. Such process conditions have been shown by experiment to result in the growth of a layer of electrically-connected metal containing perforations 42 with diameters about 10 nm over 4–10% of the area of the metal layer 41. Further, a second semiconductor layer 43 comprising a superlattice of low and high band gap material may be formed by a first layer of aluminum gallium arsenide with an aluminum content equal to 0.30 of the total aluminum and gallium content, epitaxially grown to a thickness of approximately 10 nanometers, and doped with silicon to a level of about $5 \times 10^{16}$ atoms/cm³. A second layer of gallium arsenide may be epitaxially grown to a thickness of approximately 10 nanometers and doped with silicon to a level of about $5 \times 10^{16}$ atoms/cm³. A third layer of aluminum gallium arsenide of the same doping thickness and alloy composition to the first layer further may be provided, and so on until approximately 10 layers are grown with a total thickness of about 200 nanometers. The composition and method of deposition of such layers would be advantageously selected for the intended application of the semiconductor device.

The third semiconductor layer 44 may consist of a gallium arsenide layer epitaxially grown to a thickness of about one micron and doped to a level of $10^{17}$ atoms of silicon/cm³. The ohmic metallization 45 to the third semiconductor layer 44 and the ohmic metallization 46 may include a multilayer structure of a first layer of nickel approximately 5 nanometers thick, a second layer of gold approximately 20 nanometers thick, a third layer of germanium approximately 20 nanometers thick and a fourth layer of gold approximately 100 nanometers thick, which are alloyed to a temperature of 450 degrees centigrade for 30 seconds. The contact metallization 47 to the ohmic metallization 46, the contact metallization 48 to the ohmic metallization 45, and the contact metallization 49 to the metal layer 41 may comprise a first layer of titanium metal approximately 20 nanometers thick followed by a second layer of gold approximately 300 nanometers thick, the third semiconductor layer 44 and the second semiconductor layer 43 may be patterned by standard lithographic processes followed by etching with an etch such as the liquid etch $4:1:1::H_2SO_4:H_2O_2:H_2O$ or the plasma etch $CCl_2F_2$ as described above which etch the gallium arsenide and aluminum gallium arsenide layers far faster than they etch the tungsten layers and allow the etch to fully penetrate the semiconductor layers 44 and 43 and stop at the tungsten layer 42. Further, the tungsten layer 42 may be patterned by standard lithographic techniques and may be etched by a plasma etch such as 95% $CF_4 + 5\% O_2$ at 13 MHz at a pressure 1.5 Torr which has been shown to etch tungsten and its alloys far faster than gallium aluminum arsenide and allows the etch to penetrate the tungsten layer and stop at the semiconductor surface.

Figure 3C:
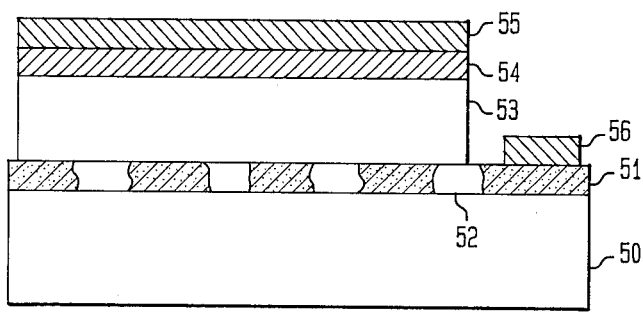
FIG. 3(c) shows a cross sectional view of a portion of a semiconductor body which was formed according to a third embodiment of the method according to the present invention.

FIG. 3c illustrates a third preferred embodiment of the present invention which includes a first semiconductor layer 50, a second semiconductor layer 53 epitaxially grown to the first semiconductor layer 50, a layer of Schottky metallization 54 deposited over the second semiconductor layer 53, and a layer of contact metallization 55 applied over the Schottky metallization 54, and a layer of contact metallization 56 applied over the metal layer 51. The contact metallization 55 and 56 provide means for applying electrical voltages to the structure so as to modulate the electric field inside the second semiconductor layer 53, which may have the application of causing the optical properties of the device to change and enabling the structure to function as an electro-optic modulator.

In this preferred embodiment of the present invention the first semiconductor layer 50 may be gallium arsenide, doped to a level of less than $10^{16}$ atoms/cm³ of silicon, the metal layer 51 may be tungsten, grown at a temperature and rate of deposition as described above which are known to produce a layer containing perforations 52. The second semiconductor layer 53 may comprise gallium arsenide doped to a level less than $10^{16}$ atoms/cm³ of silicon. A layer of conductive material 54 may be deposited over the semiconductor layer 53 and forming a Schottky junction therewith. The layer 54 may be composed of titanium with a thickness of 200 nanometers. The electrical contact metallizations 55 and 56 may also be applied to the structure and may consist of a first layer composed of titanium having a thickness of 20 nanometers followed by a second layer composed of gold having a thickness of 300 nanometers.

Figure 3D:
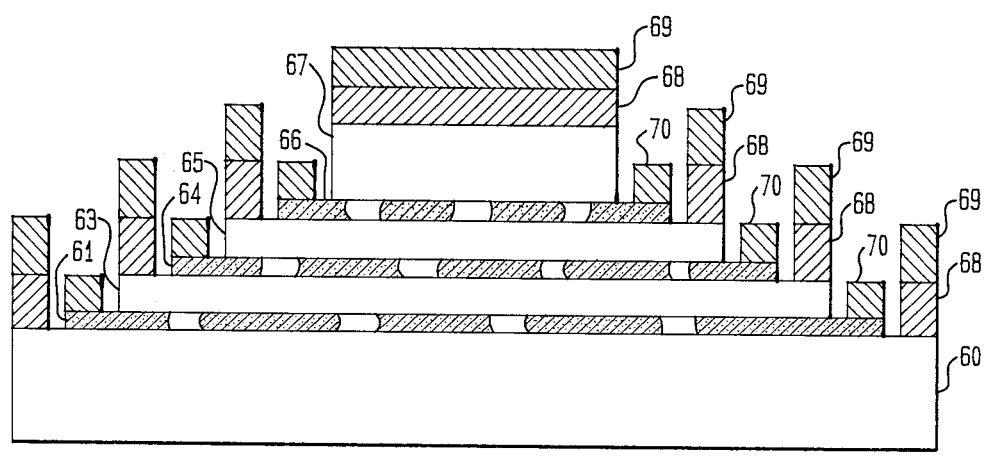
FIG. 3(d) shows a cross sectional view of a portion of a semiconductor body which was formed according to a fourth embodiment of the method according to the present invention.

FIG. 3d illustrates a fourth preferred embodiment of the present invention which comprises a multiplicity of metal layers interleaved between semiconductor layers and which is formed by repeated application of the fabrication method according to the present invention.

The Figure shows a multilayer structure including a first semiconductor layer 60, a first metal layer 61 containing perforations 62, a second epitaxial semiconductor layer 63, a second metal layer 64, a third epitaxial semiconductor layer 65, a third metal layer 66, a fourth epitaxial semiconductor layer 67, ohmic metallizations 68a, 68b, 68c and 68d to the semiconductor layers 60, 63, 65 and 67 respectively, contact metallizations 69a, 69b, 69c and 69d to the ohmic metallization 68a, 68b, 68c and 68d respectively, and contact metallizations 70a, 70b and 70c to metal layers 62, 64 and 66 respectively. The composition and method of deposition of the various layers according to the present invention may be advantageously selected for the intended application.

The contact metallizations provide means for applying electrical voltages to the semiconductor layers and the metal layers allowing the electric fields in the structure to be modulated, which may be utilized to modulate the optical properties of the device and allow the entire structure to function as an electro-optic modulator suitable for the imposition of a signal onto an optical beam (not shown).

It will be obvious to those skilled in the art that the semiconductor process according to the present invention can be implemented with various semiconductor technologies and different combinations of known process steps, and that the preferred embodiments illustrated here are merely exemplary. The thickness of the layers, depth of penetration of the various zones and regions, the interlayer materials, and in particular the configuration and distance between the various layers and zones, as well as the types of solid state devices to which the metallization is applied can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than III A-V A compounds, may be used. Furthermore, the conductivity types and dopant levels of various layers and the polarity of the operating voltages may be adapted to the specific device and application. Moreover, the voltage level and the static or dynamic nature of the signals applied to the various terminals and electrodes of the device, as well as the voltage sources, may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method of fabricating a semiconductor device comprising the steps of:
    providing a body of a III-V semiconductor material having a major surface;
    depositing a layer of tungsten by molecular beam epitaxy on said major surface of said semiconductor body to a thickness of approximately 10-to-20 nm under conditions such that apertures having a diameter of 10 to 20 nm extending substantially vertically through the thickness of said layer are formed spontaneously, without the use of a mask, during deposition of said layer.
    providing a layer of a semiconductor material over said layer of tungsten such that said layer of semiconductor material is epitaxially matched to the major surface of the body by means of lateral epitaxy; and
    providing electrical contacts to said body of III-V semiconductor material and said layer of semiconductor material.

2. A method as defined in claim 1 wherein said III-V semiconductor material is gallium arsenide.

3. A method as defined in claim 1 wherein the apertures in said layer of tungsten amount to approximately 4 to 10% of the surface area of layer of tungsten.

4. A method of fabricating a semiconductor device comprising the steps of:
    providing a body of a III-V semiconductor material having a major surface;
    depositing a layer of tungsten by molecular beam epitaxy on said major surface of said semiconductor body to a thickness of approximately 10 to 20 nm under conditions such that apertures having a diameter of 10 to 20 nm extending substantially vertically through the thickness of said layer are formed spontaneously, without the use of a mask, during deposition of said layer;
    providing a layer of semiconductor material over said layer of tungsten such that said layer of semiconductor material is epitaxially matched to the major surface of the body by means of lateral epitaxy;
    providing electrical contacts to said body of III-V semiconductor material and said layer of semiconductor material; and
    wherein said layer of semiconductor material comprises alternating layers of wide and narrow energy gap semiconductor material.

5. A method as defined in claim 1, further comprising the step of depositing a layer of conductive material over said layer of semiconductor material and forming a Schottky junction therewith.

6. A method as defined in claim 1, wherein said deposition takes place at a rate of approximately 0.1 nm/sec at a temperature of about 700° C.

7. A method of fabricating a semiconductor device comprising the steps of:
    providing a semiconductor body having a major surface,
    depositing a non-epitaxial layer of a conductive refractory material on said major surface to a thickness at which the layer is electrically-connected but contains apertures therethrough, said apertures being spontaneously formed during deposition without the use of a mask,
    forming a semiconductor layer over said layer of conductive refractory material to epitaxially match said semiconductor layer to the major surface of said semiconductor body via said apertures by a process of lateral epitaxy,
    and forming electrical contacts to said semiconductor body, to said semiconductor layer and to said layer of conductive refractory material.

8. A method as in claim 7 wherein said conductive refractory material comprises tungsten which is deposited to a thickness of approximately 10-to-20 nanometers under conditions that cause through apertures each having a diameter of about 10-to-20 nanometers to be formed spontaneously during deposition without the use of a mask.

* * * * *